(12) United States Patent
Embleton et al.

(10) Patent No.: US 9,758,277 B2
(45) Date of Patent: *Sep. 12, 2017

(54) SHOCK PALLET WITH ADJUSTABLE ANTI-TIP MECHANISM

(71) Applicant: DELL PRODUCTS, L.P., Round Rock, TX (US)

(72) Inventors: Steven Embleton, Austin, TX (US); James Don Curlee, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/212,949

(22) Filed: Jul. 18, 2016

(65) Prior Publication Data

US 2016/0325881 A1 Nov. 10, 2016

Related U.S. Application Data

(63) Continuation of application No. 14/612,449, filed on Feb. 3, 2015, now Pat. No. 9,422,083.

(51) Int. Cl.
*B65D 19/38* (2006.01)
*B65D 19/00* (2006.01)
(Continued)

(52) U.S. Cl.
CPC ......... *B65D 19/38* (2013.01); *B65D 19/0004* (2013.01); *B65D 19/0075* (2013.01); *B65D 81/02* (2013.01); *H05K 7/186* (2013.01); *H05K 7/20163* (2013.01); *B65D 2519/00084* (2013.01); *B65D 2519/00273* (2013.01); *B65D 2519/00293* (2013.01); *B65D 2519/00323* (2013.01); *B65D 2519/00338* (2013.01);
(Continued)

(58) Field of Classification Search
CPC ........... B65D 2519/00761; B65D 2519/00746; B65D 2519/00796; B65D 2519/00776; B65D 19/38; B65D 19/0024
USPC .......... 108/51.11, 57.12, 54.1; 248/560, 562, 248/566, 636, 638, 346.02, 346.05, 346.6, 248/188.4, 188.5, 188.7, 346.06
See application file for complete search history.

(56) References Cited

U.S. PATENT DOCUMENTS 1,317,550 A 9/1919 Cass
1,745,046 A * 1/1930 Romine ................ B66C 19/005
108/54.1

(Continued)

*Primary Examiner* — Jose V Chen
(74) *Attorney, Agent, or Firm* — Isidore PLLC

(57) ABSTRACT

A shock pallet assembly allows transport or movement of tall rack-mounted information handling systems (IHSes) without tipping. The shock pallet assembly can resiliently, manually or automatically retract for placement near a wall of a transport conveyance to achieve a greater shipping density of IHSes. The shock pallet assembly can include a bottom structure having a pair of parallel apertures to receive tines of a forklift. Resilient padding is positioned on a top surface of the bottom structure to provide shock dampening. A top deck is attached on top of the resilient padding and bottom structure to form a shock pallet that receives a racked-mounted IHS for transport and movement. An anti-tip mechanism can be attached to a lateral side of the shock pallet to prevent tipping of the rack-mounted IHS.

17 Claims, 6 Drawing Sheets

(51) Int. Cl.
  *B65D 81/02*  (2006.01)
  *H05K 7/20*  (2006.01)
  *H05K 7/18*  (2006.01)

(52) U.S. Cl.
  CPC .............. *B65D 2519/00796* (2013.01); *B65D 2519/00815* (2013.01); *B65D 2585/6837* (2013.01)

(56) References Cited

U.S. PATENT DOCUMENTS

| | | | |
|---|---|---|---|
| 1,747,352 A | | 2/1930 | Devine, Jr. |
| 1,812,861 A | * | 7/1931 | Chase .................. B62B 3/0625 108/136 |
| 1,818,289 A | * | 8/1931 | White .................... B65D 19/38 108/57.15 |
| 1,820,281 A | | 8/1931 | Leslie |
| 2,873,934 A | | 2/1959 | Settles |
| 2,909,349 A | | 10/1959 | Morris |
| 3,066,898 A | * | 12/1962 | Haynes ................... F16M 7/00 211/182 |
| 3,101,063 A | | 8/1963 | Wharton |
| 3,150,905 A | * | 9/1964 | Payton ................... A47B 91/16 126/191 |
| 3,176,632 A | * | 4/1965 | Yingling ................ B65D 19/42 108/54.1 |
| 3,251,322 A | | 5/1966 | Downs et al. |
| 3,267,882 A | | 8/1966 | Edward et al. |
| 3,275,131 A | | 9/1966 | Erickson |
| 3,344,750 A | | 10/1967 | Kostrewa |
| 3,373,993 A | * | 3/1968 | Oja .................. A63B 21/00181 280/43.14 |
| 3,523,507 A | | 8/1970 | Dubin |
| 3,888,368 A | * | 6/1975 | Hawkins ................ B66C 23/44 108/54.1 |
| 4,799,840 A | | 1/1989 | Gompel et al. |
| 5,588,371 A | * | 12/1996 | Looker .................. B65D 19/40 108/53.1 |
| 5,644,991 A | | 7/1997 | Prevot et al. |
| 5,706,738 A | | 1/1998 | Rapeli |
| 5,823,349 A | | 10/1998 | Bridges |
| 5,842,424 A | | 12/1998 | Prevot et al. |
| 5,970,886 A | | 10/1999 | Knio |
| 6,105,511 A | | 8/2000 | Bridges |
| 6,112,672 A | | 9/2000 | Heil |
| 6,308,922 B1 | * | 10/2001 | Hollington ............. A47B 13/02 108/57.16 |
| 6,311,941 B1 | * | 11/2001 | Feldmeyer ............. A47B 97/00 248/188.8 |
| 6,748,875 B2 | | 6/2004 | Duley |
| 6,968,958 B2 | | 11/2005 | Lauchner et al. |
| 7,673,569 B2 | | 3/2010 | Ishikawa et al. |
| 7,733,645 B2 | * | 6/2010 | Hsu ........................ F16M 11/00 248/188.1 |
| 7,785,052 B2 | | 8/2010 | Kanczuzewski et al. |
| 7,793,828 B2 | * | 9/2010 | Booth .................... G07F 19/20 108/55.3 |
| 7,909,074 B2 | | 3/2011 | Yu |
| 8,671,849 B2 | * | 3/2014 | Krieg ................... D06F 39/001 108/51.11 |
| 8,991,780 B2 | | 3/2015 | Pedersen et al. |
| 9,051,079 B2 | | 6/2015 | Kuo et al. |
| 9,067,707 B2 | * | 6/2015 | Brown .............. B65D 19/0026 |
| 9,422,083 B1 | * | 8/2016 | Embleton ............. B65D 19/38 |
| 2002/0122715 A1 | | 9/2002 | Pape et al. |
| 2009/0026426 A1 | * | 1/2009 | Willim ................... B66C 23/62 254/45 |
| 2009/0090281 A1 | | 4/2009 | Huettner et al. |
| 2010/0294175 A1 | | 11/2010 | Cummins et al. |
| 2014/0090581 A1 | | 4/2014 | Schultz |

* cited by examiner

SHOCK PALLET WITH ADJUSTABLE ANTI-TIP MECHANISM

RELATED APPLICATIONS

This application is a continuation of and claims priority from U.S. patent application Ser. No. 14/612,449, filed Feb. 3, 2015, the entire contents of which are incorporated herein by reference.

BACKGROUND

1. Technical Field

This disclosure generally relates to transport and movement of information handling systems (IHSes), and more particular to shock pallets for transporting and moving IHSes.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

An Original Equipment Manufacturer (OEM) of rack-mounted IHSes can ship hundreds of fully integrated racks a year. Each rack can contain as much as $1M of Information Technology (IT) hardware. Each rack can range in weight from as little as 700 lbs. to over 3800 lbs. These fully integrated racks are often shipped to an end user/customer and thus must be sufficiently robust to survive the transportation environment as the racks are shipped worldwide by truck, plane and/or boat. A shock pallet is the primary protection provided for the IT hardware in the rack. In addition to providing shock dampening, the width of the shock pallet needs to be wide enough to prevent tipping. For example, to maintain the tip safety factor in packaging for a tall 52 U rack, the width needs to increase significantly over that for a 48 U rack. This increased width reduces by up to 50% the overseas shipping density of rack-mounted IHSes being transported/shipped by air, water and/or over land. Reduced shipping density substantially increases logistics cost.

BRIEF SUMMARY

The illustrative embodiments of the present disclosure provide an anti-tip mechanism that can be attached to a shock pallet to form a shock pallet assembly that can be used when transporting or moving taller loads. The anti-tip mechanism maintains a safety margin to prevent tipping for a shock pallet that would otherwise be too narrow. When not needed for additional safety, the anti-tip mechanism can be retracted to allow placement of shock pallet assemblies integrated with respective taller loads into a denser configuration.

According to at least one aspect of the present disclosure, a pallet assembly is provided for rack-mounted information handling systems (IHSes). In one embodiment, the pallet assembly includes a bottom structure having a pair of parallel apertures to receive tines of a forklift. The pallet assembly includes resilient padding that is positioned on a top surface of the bottom structure to provide shock dampening. The pallet assembly includes a top deck attached on top of the resilient padding and bottom structure forming a shock pallet to receive a rack-mounted IHS during transporting or moving of the IHS. The pallet assembly includes an anti-tip mechanism having a base extender and a positioning member. The base extender is attachable at a first end to the shock pallet. A second end of the base extender is positionable between a retracted position proximate to the lateral side of the pallet assembly and an extended position to rigidly contact a spaced-apart portion of an underlying surface that also supports the bottom structure. The positioning member is attached to the base extender to selectably extend the base extender between the retracted position and the extended position to prevent tipping of the rack-mounted IHS.

According to at least one aspect of the present disclosure, a method is provided of constructing a pallet assembly to ship rack-mounted IHSes. In one embodiment, the method includes forming a pair of parallel apertures to receive tines of a forklift in a bottom structure. The method includes positioning resilient padding on a top surface of the bottom structure to provide shock dampening. The method includes attaching a top deck on top of the resilient padding to the bottom structure to form a shock pallet to receive a racked-mounted IHS for transport and movement. The method includes attaching anti-tipping mechanism to the pallet assembly to prevent tipping during transport or movement of the rack-mounted IHS that is attached to the top deck.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
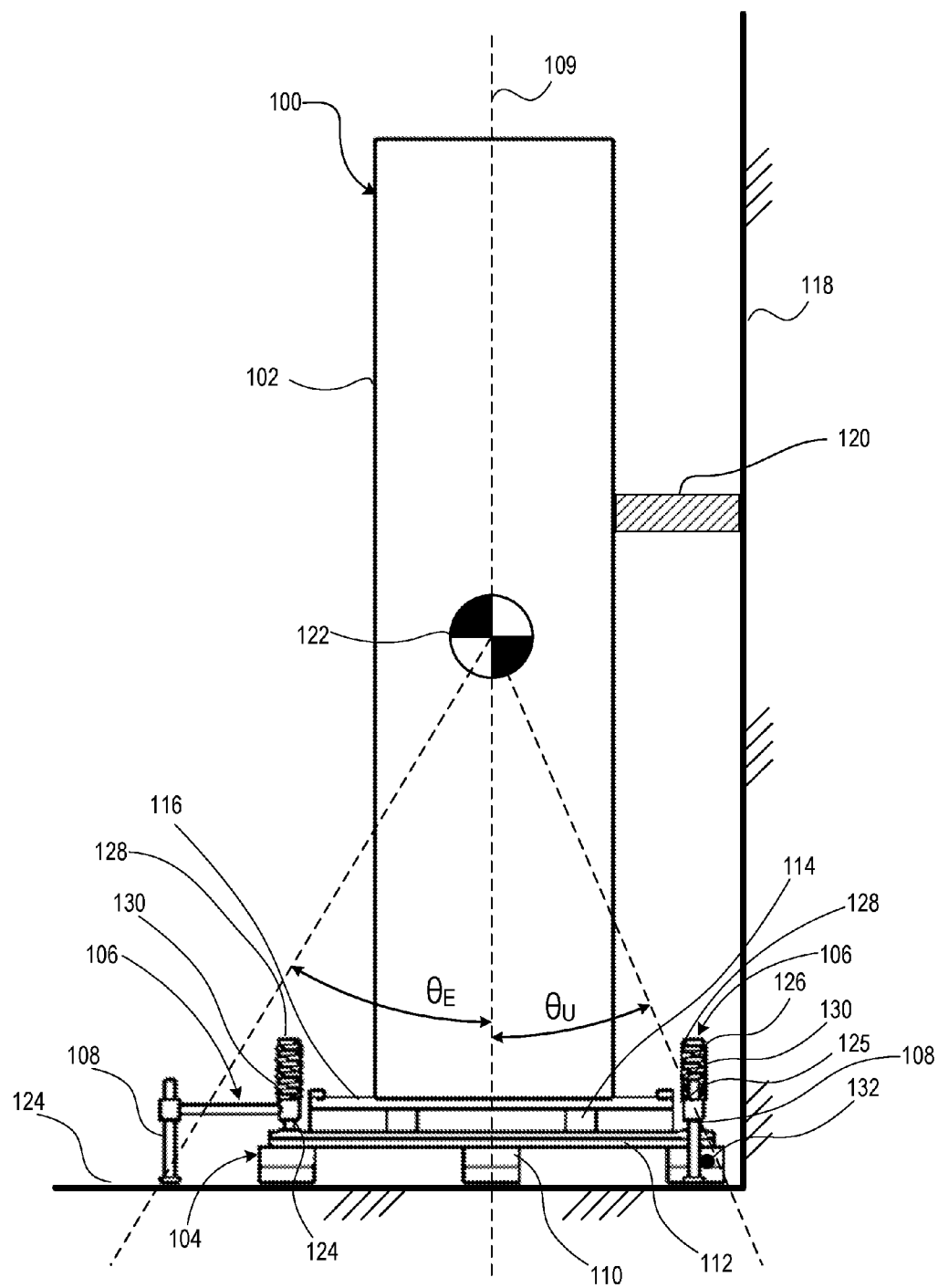
FIG. 1 illustrates front view of a fully-integrated rack of an information handling system (IHS) that is positioned on a shock pallet assembly for transport or movement with one anti-tip mechanism extended and another retracted, according to one or more embodiments.

The present disclosure provides a shock pallet assembly that can be utilized to ship tall rack-mounted information handling systems (IHSes) without tipping by manually or automatically widening the shock pallet assembly. When the IHS can be attached to a support structure proximate to a lateral side of the shock pallet assembly, the shock pallet assembly can manually or automatically retract to achieve a greater shipping density of IHSes. In one embodiment, the shock pallet assembly can include a bottom structure having a pair of parallel apertures to receive tines of a forklift. Resilient padding is positioned on a top surface of the bottom structure to provide shock dampening. A top deck is attached on top of the resilient padding and bottom structure to form a pallet assembly that receives a racked-mounted IHS. A selectively-extended base extender is attachable to a lateral side of the pallet assembly to prevent tipping during transport or movement of the rack-mounted IHS.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 2:
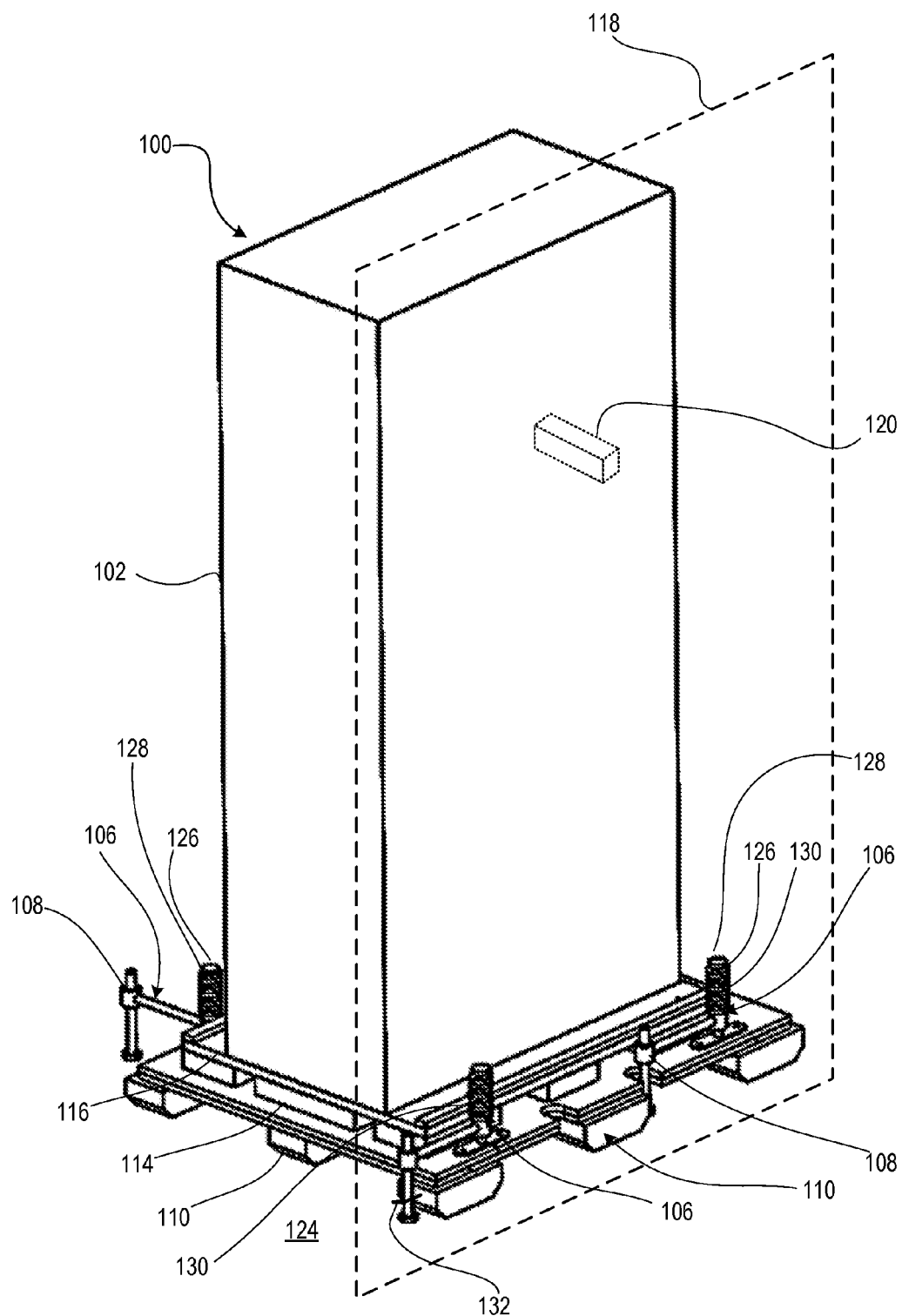
FIG. 2 illustrates a perspective view of the fully-integrated rack of FIG. 1, according to one or more embodiments.

FIGS. 1-2 illustrate an information handling system (IHS) as a fully-integrated rack 102 that is secured to a shock pallet assembly 104 for transport, shipping, or movement. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Anti-tip mechanisms 106 can selectively extend a base extender 107 that includes a pallet safety arm 108 to effectively increase a width of a shock pallet 110 for pallet tip safety. A generally known safety standard is for withstanding a tipping of 15° from a vertical axis 109 although others may be appropriate by jurisdiction or mode of transportation. In one embodiment, a shock pallet 110 provides sufficient fixed width for a fully integrated rack of height 48

U. The shock pallet 110 is constructed with a base or bottom structure 112 upon which dampening or compliance components 114 are placed and secured under a top deck 116. The shock pallet assembly 104 illustrates a left pair of anti-tip mechanisms 106 that extend sufficiently far to achieve a determined safety factor for a fully-integrated rack 102 of height 52 U.

A right pair of anti-tip mechanisms 106 is retracted for greater storage density and consequently allows for reduced shipping cost. The shock pallet assembly 104 is illustrated as being close to a wall 118 of a truck, trailer, or shipping container on the right side and can thus rely upon other packaging 120 in contact with the wall 118 to prevent tipping to the right. FIG. 1 illustrates that the maximum tip angle "$\theta_U$" from a center of gravity (COG) of the integrated combination of the fully-integrated rack 102 and the shock pallet 110 can be less than the safety standard. Thus, the maximum tip angle "$\theta_E$" from COG 122 of the integrated combination of the fully-integrated rack 102 and the shock pallet assembly 104 with the anti-tip mechanism 106 extended can be at least the safety standard.

In one embodiment, FIGS. 1-2 illustrate that the anti-tip mechanism 106 includes the pallet safety arm 108 that serves as a base extender. Pallet safety arm 108 is attachable at a first end to the shock pallet 110 and has a second end that is positionable between a retracted position and an extended position. The retracted position is proximate to the lateral side of the shock pallet 110. In the extended position, the pallet safety arm 108 rigidly contacts a spaced-apart portion of an underlying surface 124 such as a floor that also supports the bottom structure 112. The anti-tip mechanism 106 has a positioning member 126 that includes a resilient component. In particular, the anti-tip mechanism 106 includes a vertical spindle attachment 128 that receives a torsion spring 130 as the resilient component. The torsion spring 130 resiliently and horizontally rotates the pallet safety arm 108 to an extended position. Contact with the wall 118 can retract the pallet safety arm 108 with the torsion spring 130 resiliently yielding from a relaxed state to an actuated state. In addition, a holding mechanism 132 can maintain the pallet safety arm 108 in the retracted position.

Figure 3:
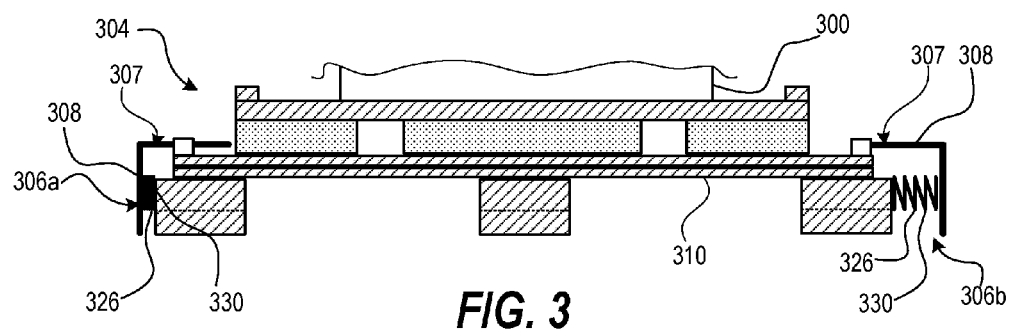
FIG. 3 illustrates a front view of a shock pallet assembly with anti-tip mechanisms that are made horizontally resilient by including a compression spring, according to one or more embodiments.

FIG. 3 illustrates a shock pallet assembly 304 that has a shock pallet 310, which supports a rack-mounted IHS 300 for transport and movement, according to one embodiment. The shock pallet assembly 304 has anti-tip mechanisms 306a, 306b that are respectively retracted and extended. Each anti-tip mechanism 306a, 306b has a base extender 307 including a pallet safety arm 308 that is slideably attached to the shock pallet 310 for horizontal translation. A positioning member 326 has a resilient component of a compression spring 330. The compression spring 330 has a moving end attached to the pallet safety arm 308. The compression spring 330 has a fixed end attached to the shock pallet 310.

Figure 4:
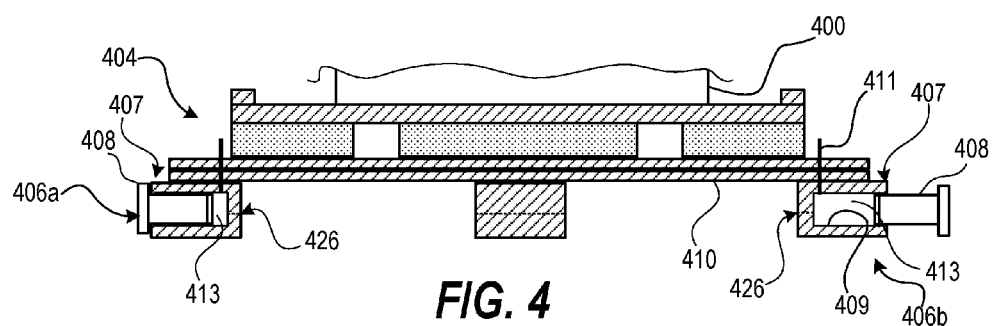
FIG. 4 illustrates a front view of a shock pallet assembly with anti-tip mechanisms each having a pneumatically resilient piston, according to one or more embodiments.

FIG. 4 illustrates a shock pallet assembly 404, which has a shock pallet 410 that supports a rack-mounted IHS 400 for transport and movement, according to another embodiment. The shock pallet assembly 404 has anti-tip mechanisms 406a, 406b that are respectively retracted and extended. Each anti-tip mechanism 406a, 406b has a base extender 407 including a piston 408, which is slideably received for horizontal translation within a bore 409 that is attached to, or incorporated in, a shock pallet 410. A positioning member 426 includes a resilient component of a pneumatic pressure system 411 that holds compressed gas 413 between the bore 409 and the piston 408.

Figure 5:
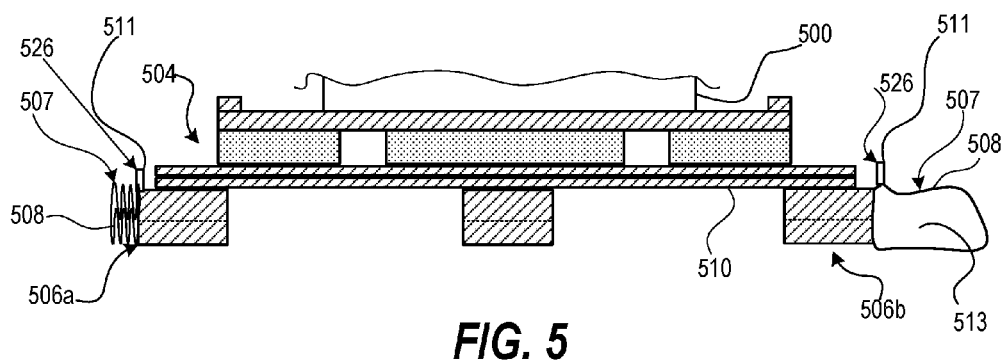
FIG. 5 illustrates a front view of a shock pallet assembly with anti-tip mechanisms that include a bladder, according to one or more embodiments.

FIG. 5 illustrates a shock pallet assembly 504 that has a shock pallet 510 that supports a rack-mounted IHS 500 for transport and movement, according to yet another embodiment. The shock pallet assembly 504 has anti-tip mechanisms 506a, 506b that are respectively retracted and extended. Each anti-tip mechanism 506a, 506b has a base extender 507 that includes a resilient component of a bladder 508. A positioning member 526 includes a resilient component of an inflation system 511 that holds compressed gas or liquid 513 to extend and make rigid the bladder 508.

Figure 6:
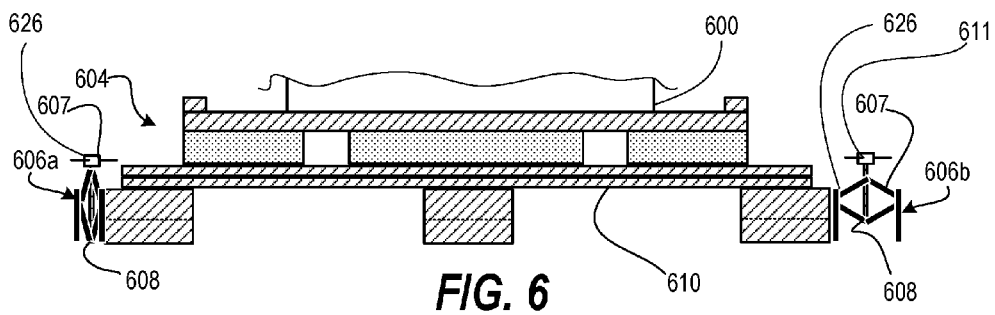
FIG. 6 illustrates a front view of a shock pallet assembly with anti-tip mechanisms that are manually extendable, according to one or more embodiments.

FIG. 6 illustrates another embodiment of a shock pallet assembly 604, which has a shock pallet 610 that supports a rack-mounted IHS 600 for transport and movement. The shock pallet assembly 604 has anti-tip mechanisms 606a, 606b that are respectively retracted and extended. Each anti-tip mechanism 606a, 606b has a base extender 607 that includes a manually-actuated mechanism of a scissoring extension bracket 608. A positioning member 626 includes a jack screw mechanism 611.

Figure 7:
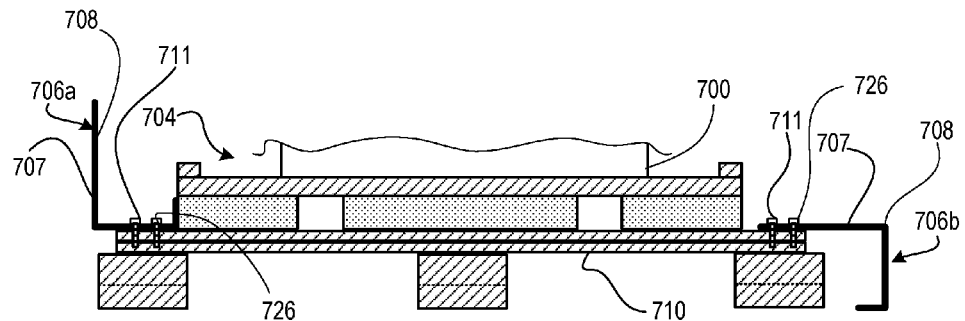
FIG. 7 illustrates a front view of a shock pallet assembly with anti-tip mechanisms that are mechanically engageable, according to one or more embodiments.

FIG. 7 illustrates yet another embodiment of a shock pallet assembly 704 that has a shock pallet 710 that supports a rack-mounted IHS 700 for transport and movement. The shock pallet assembly 704 has anti-tip mechanisms 706a, 706b that are respectively retracted and extended. Each anti-tip mechanism 706a, 706b has a base extender 707, which includes a pallet safety arm 708 that is manually engaged in an extended position or that is disengaged and stowed for the retracted position. A positioning member 726 includes fasteners 711.

Figure 8:
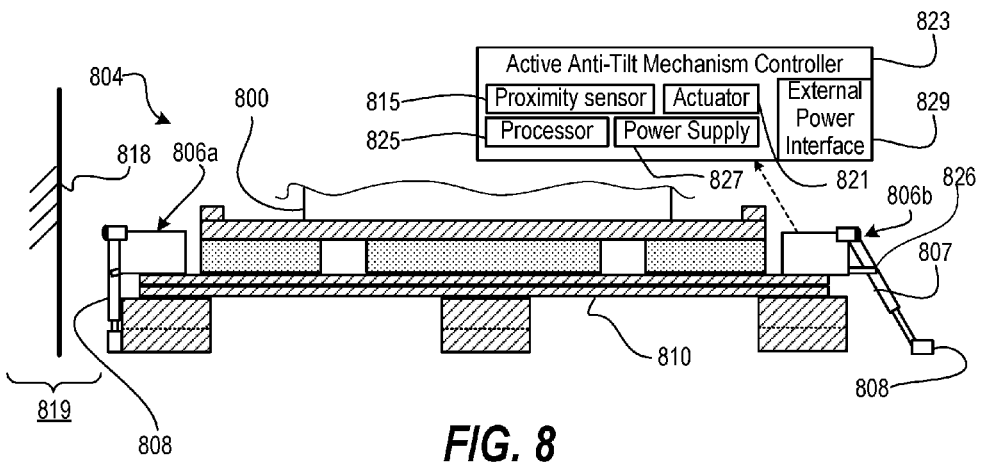
FIG. 8 illustrates a front view of a shock pallet assembly with anti-tip mechanisms that are electrically actuated, according to one or more embodiments.

FIG. 8 illustrates a final embodiment of a shock pallet assembly 804, which has a shock pallet 810 that supports a rack-mounted IHS 800 for transport and movement. The shock pallet assembly 804 has anti-tip mechanisms 806a, 806b that are respectively retracted and extended. Each anti-tip mechanism 806a, 806b includes a proximity sensor 815 to detect a surface such as a wall 818 within an extension area 819 that is proximate to the lateral side of a shock pallet 810. A positioning member 826 includes an electrically-powered actuator 821 in a controller 823 to move a base extender 807, such as a pallet safety arm 808 that pivots and telescope between the retracted and extended positions. A processor 825 is in communication with the proximity sensor 815 and the electrically-powered actuator 821 to respond to the proximity sensor 815 not detecting the wall 818 within the extension area 819 by controlling the electrically-powered actuator 821 to extend the pallet safety arm 808. Electrical power can be locally stored in a power supply 827 or supplied via an external power interface 829.

Figure 9:
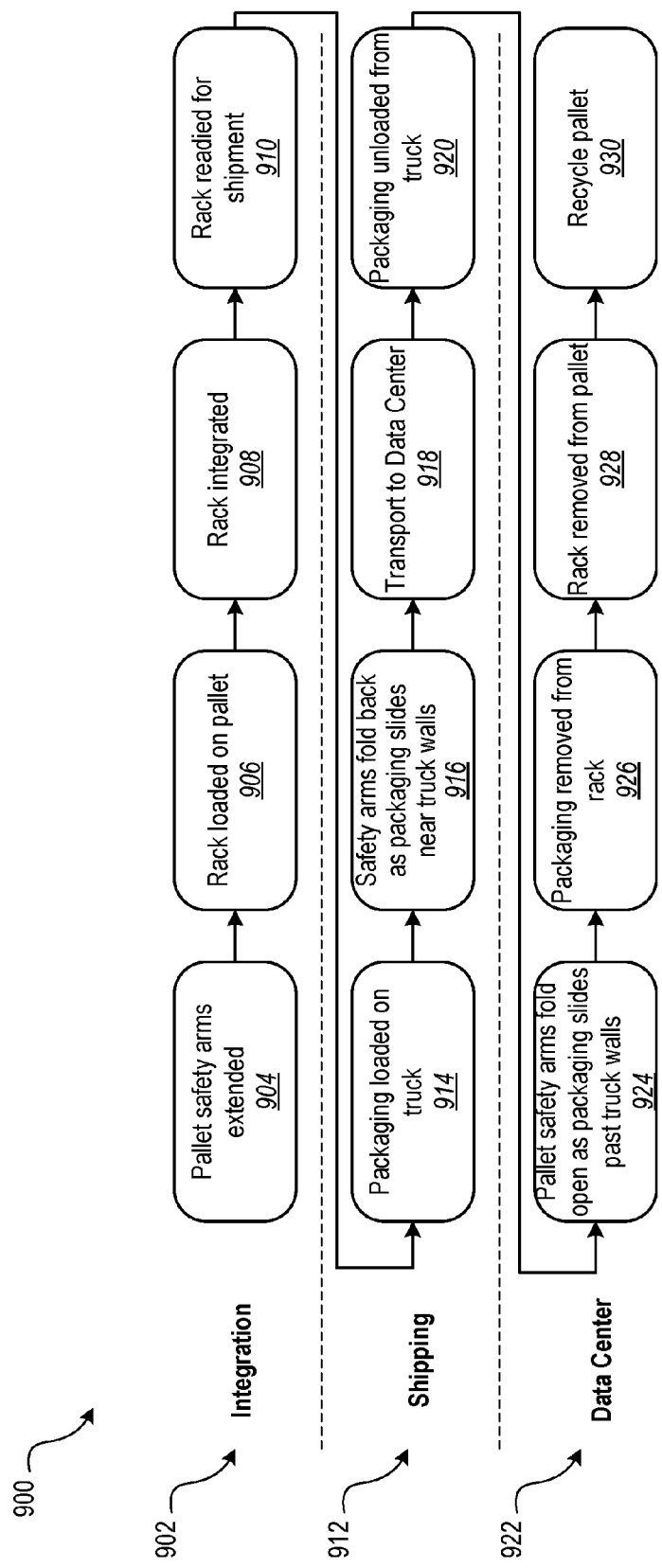
FIG. 9 illustrates a flow diagram of a method of using a shock pallet assembly with anti-tip mechanisms during integration and shipping of an IHS and at a data center, according to one or more embodiments.

FIG. 9 illustrates a method 900 of using a shock pallet assembly with anti-tip mechanisms during different phases of (i) integration of a rack-mounted IHS to a shock pallet assembly; (ii) transport, movement or shipping of the integrated IHS and shock pallet assembly; and (iii) disintegration of the rack-mounted IHS and shock pallet assembly at a data center, according to one or more embodiments. In an integration phase 902, the method 900 includes extending the pallet safety arms (block 904). For example, a user or automated manufacturing system can attach, inflate, or manually actuate the pallet safety arms to an extended position. In one embodiment, the pallet safety arms can be allowed to extend. For example, an actuated torsion or compression spring can extend the pallet safety arm. In one embodiment, the pallet safety arm is a pneumatic piston that extends. In one embodiment, an anti-tip mechanism can include an electrical actuator that responds to a sensed opportunity or external command to extend. The method 900 includes loading a rack on the pallet (block 906). Additional rack packaging can be added to integrate the rack onto the pallet (block 908). The rack is readied for movement, transport or shipping, such as by adding plastic sheeting (block 910). In a shipping phase 912, the method 900 includes loading the packaging (pallet, rack and plastic sheeting) onto a transportation conveyance such as a truck (block 914). The pallet safety arms fold back as the packaging slides near truck walls (block 916). The packaging is then transported to a data center (block 918). Once at the data center, the packaging is unloaded from the truck (block 920). In a data center phase 922, the integrated IHS and shock pallet assembly are removed from a transport or shipping conveyance and disintegrated. Pallet safety arms fold open as the packaging slides past truck walls (block 924). The packaging is removed from the rack (block 926). The rack is removed from the pallet (block 928). The pallet is then recycled (block 930).

Figure 10:
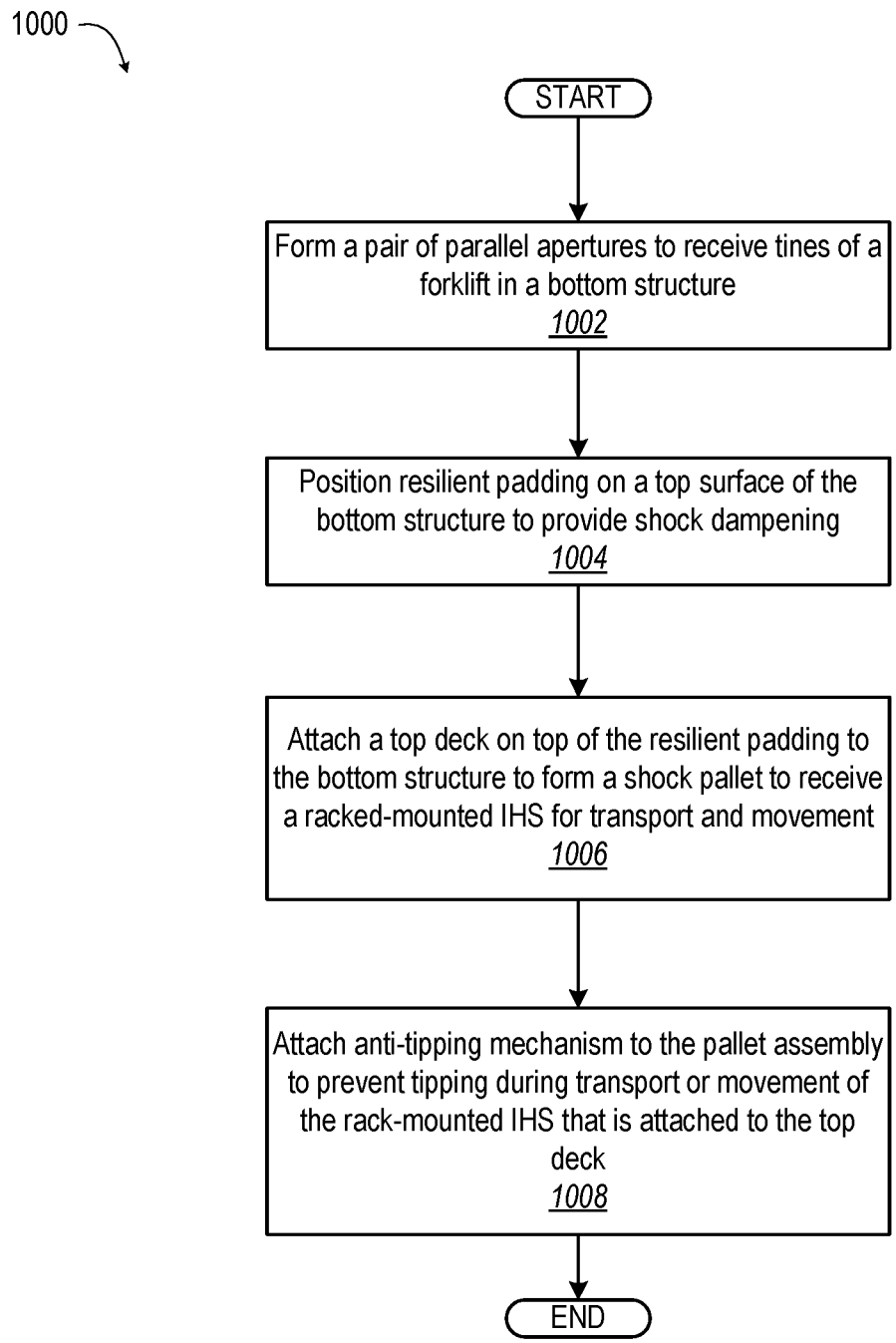
FIG. 10 illustrates a flow diagram of a method of constructing a pallet assembly having anti-tip mechanisms, according to one or more embodiments.

FIG. 10 illustrates a method 1000 of constructing a pallet assembly to transport or move rack-mounted IHS, according to one or more embodiments. In one embodiment, the method 1000 includes forming a pair of parallel apertures to receive tines of a forklift in a bottom structure of the pallet assembly (block 1002). The method 1000 includes positioning resilient padding on a top surface of the bottom structure to provide shock dampening (block 1004). The method 1000 includes attaching a top deck on top of the resilient padding to the bottom structure to form a shock pallet to receive a racked-mounted IHS for transport and movement (block 1006). The method 1000 includes attaching anti-tipping mechanism to the pallet assembly to prevent tipping during shipping of the rack-mounted IHS that is attached to the top deck (block 1008). In one or more embodiments, the anti-tip mechanisms of a shock pallet assembly can be (1) rotationally resilient by including a torsion spring; (2) horizontally resilient by including a compression spring; (3) horizontally resilient by having a pneumatically resilient piston; (4) selectably rigid and retracted by including an inflatable bladder; (5) manually extended; (6) manually engaged and disengaged; and (7) electrically actuated.

In the above described flow chart of FIGS. 9-10, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A pallet assembly for rack-mounted information handling systems (IHSs), the pallet assembly comprising:
   a pallet having a bottom structure; and
   an anti-tip mechanism comprising:
      a base extender that is attachable at a first end to the pallet and that has a second end that is positionable between a retracted position proximate to a lateral side of the pallet and an extended position to rigidly contact a spaced-apart portion of an underlying surface that also supports a bottom structure of the pallet; and
      a positioning member attached to the base extender of the anti-tip mechanism to selectably extend the base extender between a retracted position and an extended position to prevent tipping of the rack-mounted HIS, the positioning member having a passively resilient component that has a relaxed state and a constrained state.

2. The pallet assembly of claim 1, further comprising:
   resilient padding that is positioned on a top surface of the bottom structure to provide shock dampening; and a top deck attached on top of the resilient padding and bottom structure forming a shock pallet to receive a racked-mounted IHS during transporting or moving of the IHS.

3. The pallet assembly of claim 1, wherein the passively resilient component has the relaxed state in the extended position of the base extender and has the constrained state in the retracted position of the base extender.

4. The pallet assembly of claim 1 wherein:
the base extender comprises a vertical spindle that is attachable to the pallet assembly and comprises a pallet safety arm having the first end received by the vertical spindle for horizontal rotation and having the second end to rigidly contact the underlying surface; and
the resilient component of the positioning member comprises a torsion spring received around the vertical spindle and having a moving end attached to the pallet safety arm and having a fixed end coupled to the shock pallet.

5. The pallet assembly of claim 1, wherein:
the base extender comprises a pallet safety arm slideably attached to the pallet for horizontal translation; and
the resilient component of the positioning member comprises a compression spring having a moving end attached to the pallet safety arm and having a fixed end attached to the pallet.

6. The pallet assembly of claim 1, wherein:
the base extender comprises a piston slideably received for horizontal translation within a bore that is attached to the pallet;
the resilient component comprises compressed gas; and
the positioning member comprises a pneumatic pressure system to receive and to contain the compressed gas between the bore and the piston.

7. The pallet assembly of claim 1, wherein:
the base extender comprises a bladder;
the resilient component comprises compressed gas or fluid; and
the positioning member comprises an inflation system to receive the compressed gas or fluid into the bladder to extend and make the bladder rigid.

8. The pallet assembly of claim 1, wherein the positioning member comprises a manually actuated mechanism.

9. The pallet assembly of claim 8, wherein:
the base extender comprises a scissoring extension bracket; and
the manually actuated mechanism of the positioning member comprises a jack screw mechanism.

10. The pallet assembly of claim 8, wherein:
the base extender comprises a pilot safety arm; and
the manually actuated mechanism of the positioning member comprises fasteners to attach the first end of the pilot safety arm to the shock pallet, wherein the retracted position of the base extender comprises a stowed state.

11. The pallet assembly of claim 1, wherein the positioning member comprises an electrically-powered actuator.

12. The pallet assembly of claim 11, further comprising:
a proximity sensor, which detects a surface within an extension area that is proximate to the lateral side of the pallet; and
a processor in communication with the proximity sensor and the electrically-powered actuator to respond to the proximity sensor not detecting the surface within the extension area by controlling the electrically-powered actuator to extend the base extender.

13. A method of constructing a pallet assembly for rack-mounted information handling systems (IHSes), the method comprising:
forming a pair of parallel apertures to receive tines of a forklift in a bottom structure; and
attaching anti-tipping mechanism to the pallet assembly to prevent tipping during transport or movement of the rack-mounted IHS that is attached to the top deck, the attaching of the anti-tipping mechanism comprising:
attaching a first end of a base extender to the shock pallet, wherein the base extender has a second end that is positionable between a retracted position proximate to a lateral side of the pallet assembly and an extended position to rigidly contact a spaced-apart portion of an underlying surface that also supports the bottom structure; and
attaching a positioning member to the base extender to selectably extend the base extender between the retracted position and the extended position to prevent tipping of the rack-mounted IHS.

14. The method of claim 13, wherein the positioning member comprises a passively resilient component has a relaxed state in the extended position of the base extender and that has a constrained state in the retracted position of the base extender.

15. The method of claim 13, wherein the positioning member comprises a manually actuated mechanism.

16. The method of claim 13, wherein:
the positioning member comprises an electrically-powered actuator; and
attaching the position system comprises:
providing a proximity sensor to detect a surface within an extension area that is proximate to a lateral side of the pallet assembly; and
providing a processor in communication with the proximity sensor and the electrically-powered actuator to respond to the proximity sensor not detecting the surface within the extension area by controlling the electrically-powered actuator to extend the base extender.

17. The method of claim 13, further comprising:
forming a pair of parallel apertures to receive tines of a forklift in a bottom structure;
positioning resilient padding on a top surface of the bottom structure to provide shock dampening; and
attaching a top deck on top of the resilient padding to the bottom structure to form a shock pallet to receive a racked-mounted IHS for transport and movement.

* * * * *